(12) United States Patent
Pittner

(10) Patent No.: US 11,081,411 B2
(45) Date of Patent: Aug. 3, 2021

(54) SEMICONDUCTOR STRUCTURE

(71) Applicant: X-FAB SEMICONDUCTOR FOUNDRIES GMBH, Erfurt (DE)

(72) Inventor: Matthias Pittner, Thuringia (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 16/537,945

(22) Filed: Aug. 12, 2019

(65) Prior Publication Data
US 2020/0051875 A1 Feb. 13, 2020

(30) Foreign Application Priority Data
Aug. 13, 2018 (GB) ..................................... 1813179

(51) Int. Cl.
*H01L 21/66* (2006.01)
*G01R 31/28* (2006.01)
*H01L 23/544* (2006.01)

(52) U.S. Cl.
CPC .......... *H01L 22/34* (2013.01); *G01R 31/2831* (2013.01); *H01L 22/12* (2013.01); *H01L 23/544* (2013.01); *H01L 2223/5446* (2013.01)

(58) Field of Classification Search
CPC ....... H01L 22/34; H01L 22/12; H01L 23/544; H01L 2223/5446; H01L 29/861; H01L 22/14; G01R 31/2831

(Continued)

(56) References Cited

U.S. PATENT DOCUMENTS

2007/0200587 A1* 8/2007 Doong ............. G01R 31/31722
324/762.01
2007/0296439 A1* 12/2007 Feustel ................... H01L 22/34
324/754.03

(Continued)

OTHER PUBLICATIONS

Combined Search and Examination Report for GB1813179.7 dated Feb. 1, 2019, 7 pages.

*Primary Examiner* — Dzung Tran
(74) *Attorney, Agent, or Firm* — Nixon & Vanderhye PC

(57) ABSTRACT

A semiconductor structure (100; 200) is provided. The semiconductor structure (100; 200) comprises a substrate (5); a plurality of test structures (101, 102, 201, 202) on the substrate, wherein the plurality of test structures comprise a first set of test structures (101, 102) and a second set of test structures (201, 202); a plurality of test electrodes (10, 20, 30) provided on the substrate, wherein the test electrodes comprise a first set of electrodes (10) operatively connected to the first set of test structures (101, 102), and a second set of electrodes (20) operatively connected to the second set of test structures (201, 202), wherein the first set of electrodes (10) are spaced apart from one another by a predetermined pitch and are configured to be operatively connectable to a probe card (8) having a plurality of probe pins (7) spaced apart from one another by the predetermined pitch to test the first set of test structures, and wherein the second set of electrodes (20) are spaced apart from one another by the predetermined pitch and are configured to be operatively connectable to the probe card (8) to test the second set of test structures; and wherein at least one electrode within the second set of electrodes (20) is disposed between adjacent electrodes within the first set of electrodes (10) along a length of the first set of electrodes (V).

20 Claims, 3 Drawing Sheets

(58) Field of Classification Search
USPC .......................................................... 257/48
See application file for complete search history.

(56) References Cited

U.S. PATENT DOCUMENTS

| | | | |
|---|---|---|---|
| 2013/0105924 A1* | 5/2013 | Kobayashi | H01L 27/1464 |
| | | | 257/431 |
| 2015/0054532 A1* | 2/2015 | Yoo | G01R 31/2879 |
| | | | 324/750.01 |
| 2015/0113343 A1 | 4/2015 | Lee et al. | |
| 2017/0176358 A1* | 6/2017 | Yeh | G01R 31/307 |
| 2018/0012814 A1 | 1/2018 | Zhan et al. | |

\* cited by examiner

SEMICONDUCTOR STRUCTURE

This application claims priority to GB Patent Application No. 1813179.7 filed Aug. 13, 2018, the entire contents of which are hereby incorporated by reference.

TECHNICAL FIELD

The present disclosure relates to a semiconductor structure and a method of testing the same using a probe card. More particularly, but not exclusively, the present disclosure relates to a semiconductor structure for process control monitoring of a semiconductor manufacturing process.

BACKGROUND

It is known that semiconductor fabrication plants (also called as foundries) evaluate the quality and stability of a semiconductor manufacturing process, by measuring electrical parameters of wafers at selected steps during the manufacturing process and/or when the wafers are finished with the process. The foundries commonly use process control monitors (PCMs) for this purpose.

FIG. 1 illustrates a typical wafer 1. The wafer 1 includes a semiconductor substrate 5, which for example may be a silicon substrate. A plurality of semiconductor chips 2 are fabricated on the substrate 5 by a semiconductor manufacturing process. The chips 2 include integrated circuits which are often ordered by customers of the foundries, and therefore may also be called customer chips 2. The chips 2 are separated from one another by scribe lines 3, which are to be sawed during packaging processes in order to individually package the chips 2. The substrate 5 also has PCMs 4 made thereon. Usually, the PCMs 4 are simultaneously fabricated on the substrate 5 along with the chips 2. The PCMs 4 are commonly provided within the scribe lines 3 of the wafer 1. PCMs 4 provided in the scribe lines 3 may also be referred to as scribe line monitors. Sometimes it is not be possible to place the PCMs 4 within the scribe lines 3. For example, certain manufacturing/packaging processes may require metal-free scribe lines, or the scribe lines 3 do not provide enough space to accommodate particular PCMs. In those cases, one or more chips 2 need to be sacrificed in order to accommodate the PCMs 4 within the valuable area of the sacrificed chips 2.

Each PCM 4 includes a plurality of test structures (such as metal resistors, polysilicon resistors, contact vias, transistors, transistor arrays, capacitors, photodiodes, etc.) and test pads (which may also be called as PCM pads) electrically connected to the test structures. In use, a piece of test equipment is electrically connected to the test pads via a probe card, and the test equipment then performs electrical tests to the test structures. In this way, the foundry which made the wafer 1 is able to evaluate and assure device quality.

FIG. 2 illustrates a part of an exemplary probe card 8, which is used for connecting the test pads within the PCMs 4 to the test equipment. The probe card 8 includes a plurality of probes 6. Each of the probe 6 has a probe pin 7 at the tip thereof for directly contacting the test pads. Opposite ends of the probes 6 may be connected to the test equipment (not shown) via cables in order to receive programmed electrical signals from the test equipment. Probes 6 are sufficiently electrically isolated from one another to reduce DC leakage currents and cross-coupling of high-frequency signals down to acceptable levels. Each probe card has a certain probe arrangement defined by probe count and probe pitch. The probe pitch defines the spacing between neighbouring probe pins 7. The term "pitch" generally refers to centre-to-centre distance. The probe pitch defines the maximum voltage applicable to neighbouring probes. In a non-limiting example, the probe card 8 includes sixteen probes 6 with a probe pitch P1 of 115 µm. This particular pitch allows up to 1100 Volts being applied to neighbouring probes based upon Paschen's law. As shown in FIG. 2, the probe pins 7 of the probes 6 are aligned along a straight line. It is common (albeit not necessary) for the probe pins 7 to be equally spaced apart from one another.

FIGS. 3 and 4 illustrate plan views of an exemplary semiconductor structure 14 which may be fabricated on the substrate 5 as a part of the PCMs 4 for use with the probe card 8. The structure 14 includes an array of test pads 9 made on the substrate 5. As shown in FIG. 4, test structures 11, 12, 13 (among others) are fabricated between the test pads 9, and are electrically connected to at least one of the test pads 9. For example, the test structure 11 may be a metal resistor formed by one layer of metal provided by the semiconductor manufacturing process. Two nodes of the metal resistor 11 may be electrically connected to two test pads 9 at its immediate left and right sides, respectively. The test structure 12 may be a polysilicon resistor and be electrically connected between two test pads 9 at the immediate left and right sides of the structure 12. As shown in FIGS. 3 and 4, the test pads 9 are spaced apart from one another by a pitch P2. The pitch P2 of the test pads 9 is conventionally selected to match the probe pitch P1 of a probe card to be used. For example, in order to use the probe card 8 to test the test structures within the structure 14, the test pads are designed to have a pitch of 115 µm which is equal to the probe pitch P1. As a result, the probe pins 7 of the probe card 8 are able to electrically connect to a set of sixteen consecutive test pads 9 simultaneously as shown in FIG. 3. By supplying suitable electrical signals to the probe pins 7 by the test equipment, the test structures 11, 12, 13 (among others) connected to the set of sixteen test pads 9 can be tested in one go without requiring any adjustment to the position of the probe card 8 or the position of the substrate 5. The dimension of each test pad is generally around 60 µm*60 µm given the pitch P2 of 115 µm. A PCM 4 may include a test line having more than sixteen test pads. A test line generally refers to an array of test pads which are located along a line within a scribe line 3 or a chip 2 with test structures connected thereto. In order to test remaining parts of the test line, the substrate 5 is moved relative to the probe card 8 over the tested set of sixteen consecutive test pads 9 (e.g., by a distance of at least 16*P2) to connect to the remaining ones of the test pads 9.

For test structures which have small dimensions (e.g., the test structures 11, 12) relative to the spacing between adjacent test pads, the silicon space between adjacent test pads may not be fully utilised. For example, as shown in FIG. 4, the space 15 between the test structures 11, 12 and adjacent test pads 9 does not have any test structure made thereon and therefore is not efficiently used.

As semiconductor devices shrink in size and become more complex, it has become necessary for foundries to have more test structures within PCMs in order to monitor and control production processes in a more detailed manner. Accordingly, this requires an increasing number of test pads. As described above, the scribe lines 3 have limited area which in turn limits the number of test structures and test pads which can be placed within the scribe lines 3. Further, it is generally against the commercial interest of the foundries to sacrifice the valuable area of the customer chips 2 for placing PCMs. Therefore it is beneficial to maximize the number of test structures and test pads placed per unit area.

On the other hand, the probe arrangement (in particular, the probe pitch) within a probe card is optimized in terms of test requirements, e.g. to avoid so-called arcing when applying high voltages to adjacent probes, and the standard arrangement of test pads (in particular the pitch of the test pads) within a PCM is conventionally designed to follow the probe arrangement. This causes the consumed area of the test pads to be fixed by the standard arrangement of the test pads and/or the probe arrangement, rather than being dependent upon the actual size of the test structures. Accordingly, this may lead to empty area (such as the area 15 shown in FIG. 4) around test structures between adjacent test pads. The empty area may be substantial when the test structures are of a small dimension as compared to the spacing of the test pads. However, due to the conventional wisdom that the arrangement of test pads needs to follow the probe arrangement, it remains challenging to utilise such empty area to place more test structures therein.

Thus there is a need for a semiconductor structure which can be used as PCMs in compliance with relevant test requirements whilst achieving improved area efficiency of test structures.

It is an object of the present disclosure, among others, to provide such a semiconductor structure.

SUMMARY

According to a first aspect of the present disclosure, there is provided a semiconductor structure comprising: a substrate; a plurality of test structures on the substrate, wherein the plurality of test structures comprise a first set of test structures and a second set of test structures; a plurality of test electrodes provided on the substrate, wherein the test electrodes comprise a first set of electrodes operatively connected to the first set of test structures, and a second set of electrodes operatively connected to the second set of test structures, wherein the first set of electrodes are spaced apart from one another by a predetermined pitch and are configured to be operatively connectable to a probe card having a plurality of probe pins spaced apart from one another by the predetermined pitch to test the first set of test structures, and wherein the second set of electrodes are spaced apart from one another by the predetermined pitch and are configured to be operatively connectable to the probe card to test the second set of test structures; and wherein at least one electrode within the second set of electrodes is disposed between adjacent electrodes within the first set of electrodes along a length of the first set of electrodes.

Advantageously, the first aspect of the present disclosure allows the area efficiency and the density of the plurality of test structures to be improved, without compromising test requirements associated with the probe arrangement within the probe card.

In particular, by disposing at least one electrode within the second set of electrodes between adjacent electrodes within the first set of electrodes along a length of the first set of electrodes, the test electrodes are more densely packed than the conventional pad arrangement described above (which follows the probe arrangement within the probe card). Accordingly, it allows more test structured to be placed per unit area of the substrate.

Further, by making the first set of electrodes to be spaced apart from one another by a pitch which is equal to the pitch of the probe pins, the first set of test structures can be tested using the probe card under the test requirements associated with the probe card. The test requirements define, for example but not limited to, maximum voltage applicable to neighbouring probes. Similarly, by making the second set of electrodes to be spaced apart from one another by the pitch of the probe pins, the second set of test structures can be tested using the probe card under the same test requirements associated with the probe card. It would not be necessary to modify the test requirements in order to test the first and second sets of test structures. Therefore, the relevant test requirements associated with the probe card are complied with.

Therefore, the first aspect of the present disclosure allows the number of test electrodes (and accordingly the number of test structures) per unit area to be increased, without requiring any changes to the probe card being used for testing. Accordingly, the test requirements associated with the probe card are not compromised by the increased densities of the test electrodes.

The term "test electrodes" may be used interchangeably with "test pads".

The expression of "disposed between" is intended to mean that at least one electrode within the second set of electrodes may be disposed partially or wholly between adjacent electrodes within the first set of electrodes along the length of the first set of electrodes.

The expression of "extending along a length of the first set of electrodes" may be used interchangeably with "extending along a centre line of the first set of electrodes".

It will be understood that the probe card is used for testing the semiconductor structure, and does not form a part of the semiconductor structure.

The expression of "operatively connected" or "operatively connectable" generally means "electrically connected" or "electrically connectable", respectively.

The term "pitch" may be used interchangeably with "spacing", "on-centre spacing" or "centre-to-centre distance".

The first and second sets of electrodes may be arranged in an alternating manner along the length of the first set of electrodes.

The first and second sets of electrodes may be interleaved along the length of the first set of electrodes.

The first and second sets of electrodes may be arranged such that one of the probe card and the semiconductor substrate is movable relative to the other of the probe card and the semiconductor substrate by a distance which is less than the predetermined pitch so as to cause the probe pins to move from the first set of electrodes to the second set of electrodes.

The term "distance" may also be referred to as "stepping distance", and represents the shortest distance by which one of the probe card and the semiconductor substrate moves relative to the other of the probe card and the semiconductor substrate in one step so as to cause the probe pins to move from the first set of electrodes to the second set of electrodes.

The plurality of test electrodes may be process control monitoring, PCM, pads.

The substrate may be a semiconductor substrate.

The substrate may be at least a part of a semiconductor wafer which comprises a plurality of semiconductor chips separated from one another by scribe lines.

The plurality of test electrodes may be disposed in at least one of the scribe lines.

Alternatively, the plurality of test electrodes may be disposed within at least one of the semiconductor chips.

At least some electrodes within the first set of electrodes may have a uniform first dimension, and at least some electrodes within the second set of electrodes may have a uniform second dimension.

The first dimension may be identical to the second dimension.

The first and second sets of test structures may comprise at least one of a resistor, a connection via, and a transistor.

The first set of electrodes may be arranged along a first axis, and the second set of electrodes may be arranged along the first axis. That is, the first and second sets of electrodes may form a test line.

At least one electrode within the second set of electrodes may be centred between adjacent electrodes within the first set of electrodes along the length of the first set of electrodes.

The first and second sets of electrodes may be arranged such that one of the probe card and the semiconductor substrate is movable relative to the other of the probe card and the semiconductor substrate by a distance which is equal to a half of the predetermined pitch so as to cause the probe pins to move from the first set of electrodes to the second set of electrodes.

The plurality of test structures may comprise a third set of test structures. The test electrodes may comprise a third set of electrodes operatively connected to the third set of test structures. The third set of electrodes may be spaced apart from one another by the predetermined pitch and may be configured to be operatively connectable to the probe card to test the third set of test structures.

At least one electrode within the third set of electrodes may be disposed immediately between one of the first set of electrodes and one of the second set of electrodes along the length of the first set of electrodes.

It will be understood that the expression "immediately between" means that there is no further electrode (in addition to the at least one electrode within the third set of electrodes) that is disposed between the one of the first set of electrodes and the one of the second set of electrodes along the length of the first set of electrodes.

The first, second and third sets of electrodes may be interleaved along the length of the first set of electrodes.

The first, second and third sets of electrodes may be arranged such that one of the probe card and the semiconductor substrate is movable relative to the other of the probe card and the semiconductor substrate by a distance which is less than the predetermined pitch so as to cause the probe pins to move from the first set of electrodes or the second set of electrodes to the third set of electrodes.

The first, second and third sets of electrodes may be arranged such that one of the probe card and the semiconductor substrate is movable relative to the other of the probe card and the semiconductor substrate by a distance which is equal to a third of the predetermined pitch so as to cause the probe pins to move from the first set of electrodes or the second set of electrodes to the third set of electrodes.

The term "distance" may also be referred to as "stepping distance", and represents the shortest distance by which one of the probe card and the semiconductor substrate moves relative to the other of the probe card and the semiconductor substrate in one step so as to cause the probe pins to move from the first set of electrodes or the second set of electrodes to the third set of electrodes.

The third set of electrodes may be spaced apart from the first and the second sets of electrodes.

That is, the third set of electrodes are not interspersed or interleaved with the first and the second sets of electrodes. There may be no further electrode(s) disposed between adjacent electrodes within the third set of electrodes. Accordingly, non-interleaved electrodes (i.e., the third set of electrodes) and interleave electrodes (i.e., the first and second sets of electrodes) may co-exist on the substrate. This allows placement of large and small test structures on the substrate while improving the area efficiency of the substrate.

The third set of test structures may comprise at least one of a photodiode, a capacitor, a transistor array.

At least one of the third set of test structures may have a larger dimension than at least one of the first and second sets of test structures.

The plurality of test structures may comprise a fourth set of test structures. The test electrodes may comprise a fourth set of electrodes operatively connected to the fourth set of test structures. The fourth set of electrodes may be spaced apart from one another by the predetermined pitch and may be configured to be operatively connectable to the probe card to test the fourth set of test structures.

The first, second, third and fourth sets of electrodes may be interleaved along the length of the first set of electrodes.

According to a second aspect of the present disclosure, there is provided a semiconductor testing system comprising a semiconductor structure according to the third aspect of the present disclosure; and a probe card which comprises a plurality of probe pins spaced from one another by the predetermined pitch.

According to a third aspect of the present disclosure, there is provided a method of testing a semiconductor structure using a probe card, wherein the probe card comprises a plurality of probe pins spaced apart from one another by a predetermined pitch, the method comprising: providing a semiconductor structure, the semiconductor structure comprising: a substrate; a plurality of test structures on the substrate, wherein the plurality of test structures comprise a first set of test structures and a second set of test structures; and a plurality of test electrodes on the substrate, wherein the test electrodes comprise a first set of electrodes operatively connected to the first set of test structures, and a second set of electrodes operatively connected to the second set of test structures, wherein the first set of electrodes are spaced apart from one another by the predetermined pitch, and the second set of electrodes are spaced apart from one another by the predetermined pitch, and wherein at least one electrode within the second set of electrodes is disposed between adjacent electrodes within the first set of electrodes along a length of the first set of electrodes; operatively connecting the probe pins to the first set of electrodes to test the first set of test structures; and operatively connecting the probe pins to the second set of electrodes to test the second set of test structures.

The expression of "disposed between" is intended to mean that at least one electrode within the second set of electrodes may be disposed partially or completely between adjacent electrodes within the first set of electrodes along the length of the first set of electrodes.

The first and second sets of electrodes may be arranged in an alternating manner along the length of the first set of electrodes.

The first and second sets of electrodes may be interleaved (or interspersed) along the length of the first set of electrodes.

The method may further comprise moving one of the probe card and the semiconductor substrate relative to the other of the probe card and the semiconductor substrate by a distance which is less than the predetermined pitch such that the probe pins are moved from the first set of electrodes to the second set of electrodes.

The plurality of test electrodes may be process control monitoring, PCM, pads.

The substrate may be a semiconductor substrate.

The method may further comprise manufacturing a plurality of semiconductor chips on the substrate, and wherein the plurality of semiconductor chips are separated from one another by scribe lines.

The plurality of test electrodes may be disposed in at least one of the scribe lines.

Alternatively, the plurality of test electrodes may be disposed within at least one of the semiconductor chips.

At least some electrodes within the first set of electrodes may have a uniform first dimension, and at least some electrodes within the second set of electrodes may have a uniform second dimension.

The first dimension may be identical to the second dimension.

The first and second sets of test structures may comprise at least one of a resistor, a connection via, and a transistor.

The first set of electrodes may be arranged along a first axis, and the second set of electrodes may be arranged along the first axis. That is, the first and second sets of electrodes may form a test line.

At least one electrode within the second set of electrodes may be centred between adjacent electrodes within the first set of electrodes along the length of the first set of electrodes.

The method may further comprise moving one of the probe card and the semiconductor substrate relative to the other of the probe card and the semiconductor substrate by a distance which is equal to a half of the predetermined pitch such that the probe pins are moved from the first set of electrodes to the second set of electrodes.

The plurality of test structures may comprise a third set of test structures. The test electrodes may comprise a third set of electrodes operatively connected to the third set of test structures. The third set of electrodes may be spaced apart from one another by the predetermined pitch. The method may further comprise operatively connecting the probe pins to the third set of electrodes to test the third set of test structures.

At least one electrode within the third set of electrodes may be disposed immediately between one of the first set of electrodes and one of the second set of electrodes along the length of the first set of electrodes.

The first, second and third sets of electrodes may be interleaved along the length of the first set of electrodes.

The method may further comprise moving one of the probe card and the semiconductor substrate relative to the other of the probe card and the semiconductor substrate by a distance which is less than the predetermined pitch such that the probe pins are moved from the first set of electrodes or the second set of electrodes to the third set of electrodes.

The method may further comprise moving one of the probe card and the semiconductor substrate relative to the other of the probe card and the semiconductor substrate by a distance which is equal to a third of the predetermined pitch such that the probe pins are moved from the first set of electrodes or the second set of electrodes to the third set of electrodes.

Alternatively, the third set of electrodes may be spaced apart from the first and the second sets of electrodes. That is, the third set of electrodes are not interspersed with the first and the second sets of electrodes. There may be no further electrode(s) disposed between adjacent electrodes within the third set of electrodes. Accordingly, non-interleaved electrodes (i.e., the third set of electrodes) and interleave electrodes (i.e., the first and second sets of electrodes) may co-exist on the substrate. This allows placement of large and small test structures on the substrate while improving the area efficiency of the substrate.

The third set of test structures may comprise at least one of a photodiode, a capacitor, a transistor array.

At least one of the third set of test structures may have a larger dimension than at least one of the first and second sets of test structures.

According to a fourth aspect of the present disclosure, there is provided a semiconductor structure for use in a method according to the third aspect of the present disclosure.

Where appropriate any of the optional features described above in relation to one of the aspects of the present disclosure may be applied to another one of the aspects of the disclosure.

BRIEF DESCRIPTION OF THE DRAWINGS

In order that the disclosure may be more fully understood, a number of embodiments of the disclosure will now be described, by way of example, with reference to the accompanying drawings, in which.

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 1:
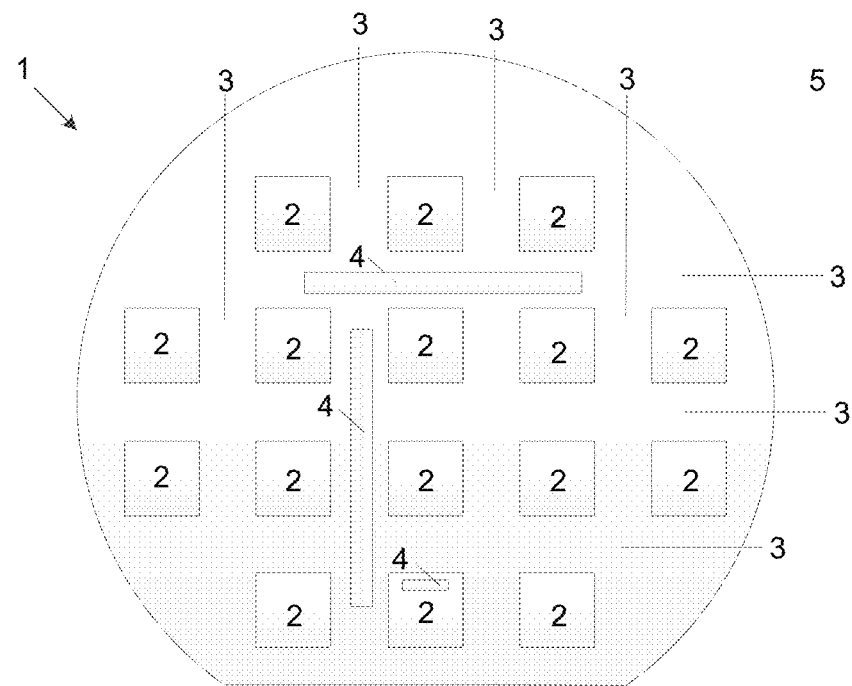
FIG. 1 is a schematic representation of a wafer on which a semiconductor structure according to the present disclosure may be provided.
Figure 2:
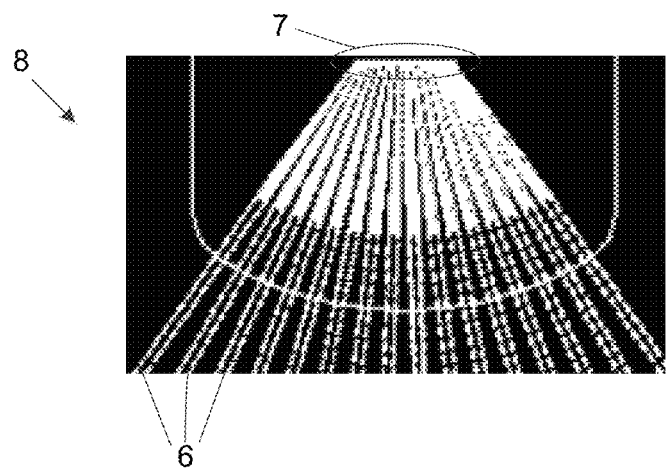
FIG. 2 is a schematic representation of a probe card which may be used with a semiconductor structure according to the present disclosure.
Figure 5:
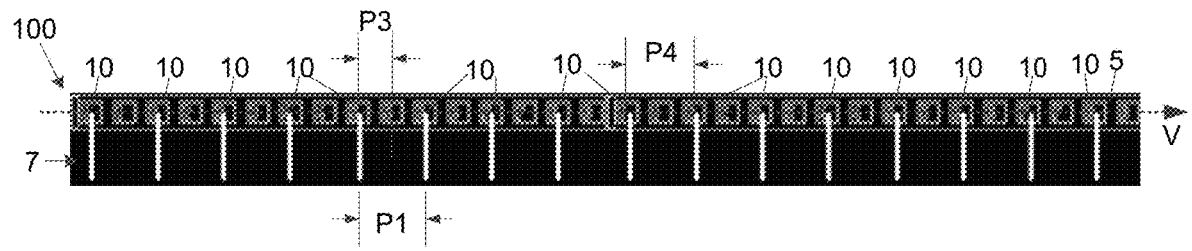
FIGS. 5 and 6 schematically illustrate plan views of a semiconductor structure according to a first embodiment of the present disclosure.
Figure 6:
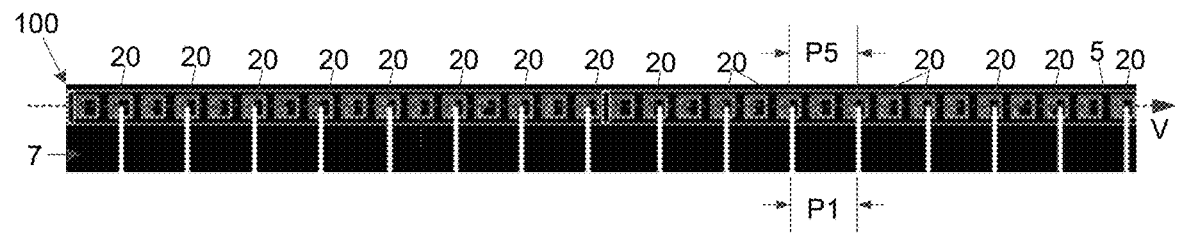

FIGS. 5 and 6 schematically illustrate the plan views of a semiconductor structure 100 according to a first embodiment of the present disclosure. The semiconductor structure 100 is fabricated on a substrate 5 of a wafer 1 as a part of PCMs (not shown but similar to the PCM 4 shown in FIG. 1). Further, the semiconductor structure 100 can be used with a probe card 8 (not shown but similar to that shown in FIG. 2) for process control monitoring of a semiconductor manufacturing process which is applied to the wafer 1.

The semiconductor structure 100 includes test electrodes 10, 20, which extend along an axis V. The axis V is shown as being parallel to a centre line of the semiconductor structure 100. In the following description, the expression of "extending along a length of the test electrodes" is deemed as equivalent to "extending along the axis V'".

The semiconductor manufacturing process conducted on the wafer 1 commonly provides on the substrate 5 active regions, dielectric layers, a plurality of metal layers which are isolated by one or more of the dielectric layers, etc. The metal layers are selectively interconnected using, for example, metal vias. In general, each of the test electrodes 10, 20 comprises metal portions from at least one of the plurality of metal layers and metal connections for interconnecting the metal portions.

The test electrodes 10 of FIG. 5 form a first set of test electrodes. The test electrodes 20 of FIG. 6 form a second set of test electrodes. As shown in FIG. 5, the test electrodes 10 are equally spaced along the axis V by a pitch P4. The pitch P4 is equal to the probe pitch P1 of the probe card 8 shown in FIG. 2. Similarly, as shown in FIG. 6, the test electrodes 20 are equally spaced along the axis V by a pitch P5. The pitch P5 is also equal to the probe pitch P1.

Further, as shown in FIGS. 5 and 6, the test electrodes 10, 20 are interspersed (or interleaved) along the axis V. In particular, the test electrodes 10, 20 are arranged in an alternating manner along the axis V, and one electrode from either the first or the second set of electrodes is placed between two neighbouring electrodes from the other set of electrodes. Further, the test electrodes 10, 20 as a whole are equally spaced by a pitch P3 along the axis V. The value of the pitch P3 is equal to a half of the pitch P1, P4 or P5. Each of the test electrodes 20 is centred between neighbouring ones of the test electrodes 10. Likewise, each of the test electrodes 10 is centred between neighbouring ones of the test electrodes 20.

The dimension of each of the test electrodes 10, 20 may be for example between 30 µm*30 µm and 40 µm*40 µm with the probe pitch P1 being equal to 115 µm. The dimension of each of the test electrodes 10, 20 is smaller than the dimension of each test electrode 9 in the structure 14 shown in FIG. 3. This is necessary in order for the test electrodes 10, 20 to be more densely packed than the test electrodes 9 along the axis V.

Figure 7:
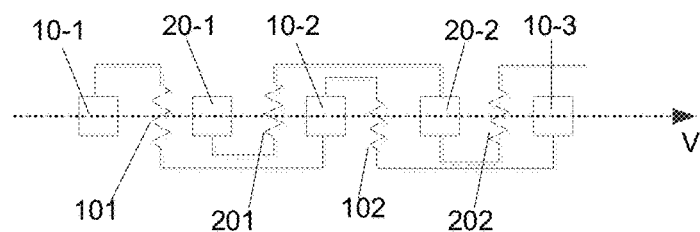
FIG. 7 is a schematic representation of test structures provided within the semiconductor structure of FIGS. 5 and 6.

FIG. 7 schematically illustrates a part of the test structures provided within the semiconductor structure 100. For simplicity, FIG. 7 only shows three of the test electrodes 10 (i.e., electrodes 10-1, 10-2, 10-3) and two of the test electrodes 20 (i.e., electrodes 20-1 and 20-2). Test structures 101, 201, 102 and 202 are located between adjacent ones of the electrodes 10, 20. For simplicity, the test structures are shown as being resistors (such as metal resistors, polysilicon resistors, or contact vias etc.). It will be appreciated that the test structures in the semiconductor structure 100 may be of different types (such as transistors, photodiodes, capacitors, etc.) depending upon the particular requirement of each foundry.

In one example, the test structures 101, 201, 102 and 202 are electrically connected to one or more of the test electrodes. Although the test structure 101 is physically positioned between the test electrodes 10-1 and 20-1, the test structure 101 is electrically connected between the test electrodes 10-1 and 10-2. Similarly, the test structure 102, which is physically positioned between the test electrodes 10-2 and 20-2, is electrically connected between the test electrodes 10-2 and 10-3. Therefore, the test structures 101 and 102 are electrically connected between the first set of test electrodes 10, and may therefore be referred to as a part of the first set of test structures. Likewise, the test structures 201 and 202 are electrically connected between the second set of test electrodes 20, and may therefore be referred to as a part of the second set of test structures.

For a test structure which has three terminals (such as, a MOSFET or a BJT), it will be appreciated that the test structure may be connected to either three electrodes within the first set of test electrodes 10 or three electrodes within the second set of test electrodes 20.

In general, the first set of test structures (including, e.g., the test structures 101 and 102) are electrically connected to the first set of electrodes 10 only, and are not electrically connected to the second set of electrodes 20. Likewise, the second set of test structures (including, e.g., the test structures 201 and 202) are electrically connected to the second set of electrodes 20 only, and are not electrically connected to the first set of electrodes 10. It will be appreciated that the particular connections between the test structures and the test pads as shown in FIG. 7 are for illustration purposes only. The foundries may design the wiring between the test structures and the test pads in any suitable way as long as the first and second sets of test structures can be tested using the probe card 8.

Figure 3:
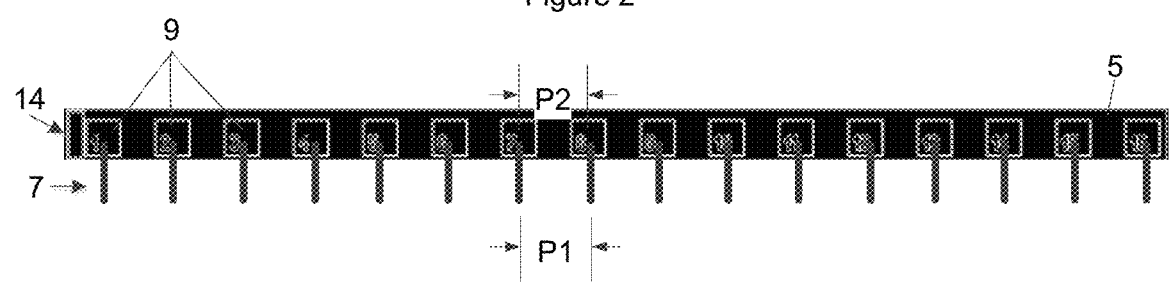
FIG. 3 schematically illustrates a plan view of a conventional test pads arrangement which is used with the probe card of FIG. 2.

As described above, the smallest pitch P3 between adjacent ones of the test electrodes 10, 20 within the semiconductor structure 100 is equal to a half of the probe pitch P1. In contrast, the smallest pitch P2 between adjacent ones of the test electrodes 9 within the structure 14 of FIG. 3 is equal to the probe pitch P1. Therefore, the number of test electrodes 10, 20 within the semiconductor structure 100 is two times the number of test electrodes 9 within the structure 14 per unit length along the axis V. Because test structures can be provided within the space between each pair of neighbouring electrodes, the semiconductor structure 100 is able to accommodate a number of test structures as much as two times the number of the test structures containable within the structure 14 per unit length. In this way, the area efficiency of test structures within the structure 100 is greatly improved (more specifically, doubled) as compared to the conventional structure 14.

In order to test the performance of the test structures contained within the structure 100, the probe card 8 is manipulated as a single unit and the probe pins 7 are brought into contact with the first set of test electrodes 10 using, for example, pattern recognition. By supplying programmed electrical signals (including voltage or current signals) to at least some of the probe pins 7 and measuring electrical signals using the rest of the probe pins 7, the electrical performance of the first set of test structures (including, e.g., the test structures 101 and 102) can be obtained.

Subsequently, the substrate 5 is moved relative to the probe card 8 by a stepping distance equal to the pitch P3 such that the probe pins 7 are moved from the first set of test electrodes 10 to the second set of test electrodes 20, and the probe pins 7 are then brought into contact with the second set of electrodes 20 to test the electrical performance of the second set of test structures (including, e.g., the test structures 201 and 202). In an alternative embodiment, the substrate 5 may stay still and the probe card 8 may be moved relative to the substrate 5 by a stepping distance equal to the pitch P3 such that the probe pins 7 are moved from the first set of test electrodes 10 to the second set of test electrodes 20 so as to test the second set of test structures.

Figure 4:
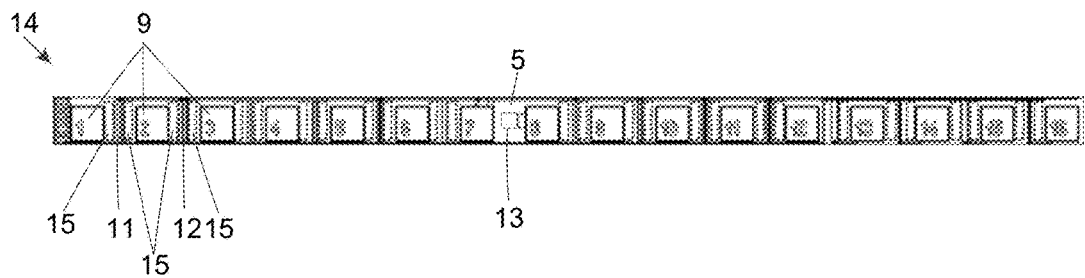
FIG. 4 schematically illustrates a plan view of test structures connected to the conventional test pads arrangement of FIG. 3.

Therefore, although the smallest pitch P3 between adjacent ones of the test electrodes 10, 20 is only a half of the probe pitch P1, all of the test structures connected to the test electrodes 10, 20 can still be tested using the probe card 8. Accordingly, the test structures provided in the structure 100 and the test structures provided in the structure 14 (in the known arrangements of FIGS. 3 and 4) can be tested using the same probe card 8 under the same test requirements (e.g., same maximum voltage applicable to neighbouring probes). It would not be necessary to modify the test requirements (e.g., to lower the maximum voltage applicable to neighbouring probes) in order to test the structure 100.

It will be appreciated that it may take longer time for testing the semiconductor structure 100 than testing the structure 14 (in the known arrangements of FIGS. 3 and 4), because the density of test structures within the structure 100 is higher than that within the structure 14.

Figure 8:
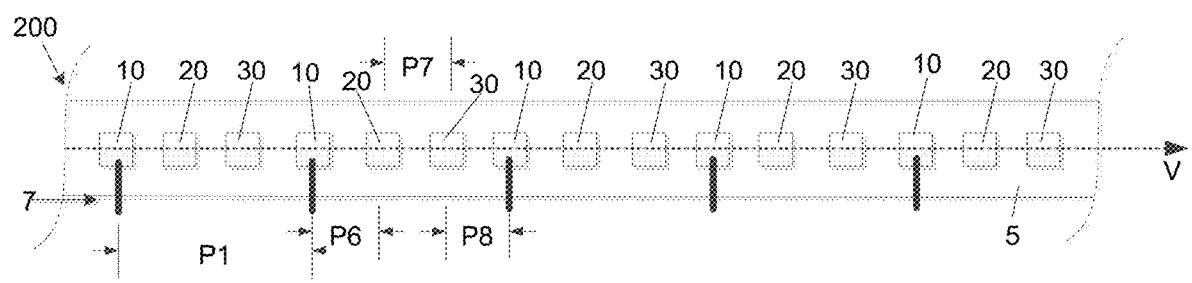
FIG. 8 schematically illustrates a plan view of a semiconductor structure according to a second embodiment of the present disclosure.

FIG. 8 illustrates a partial plan view of a semiconductor structure 200 according to a second embodiment of the present disclosure. The semiconductor structure 200 is fabricated on a substrate 5 of a wafer 1 as a part of PCMs 4 (not shown but similar to the PCM 4 shown in FIG. 1). Further, the semiconductor structure 200 can be used with a probe card 8 (not shown but similar to that shown in FIG. 2) for process control monitoring of a semiconductor manufacturing process which is applied to the wafer 1.

The semiconductor structure 200 includes test electrodes 10, 20, 30 which are arranged along an axis V. The axis V is shown as being parallel to a centre line of the semiconductor structure 200.

The test electrodes 10 form a first set of test electrodes and are equally spaced along the axis V by the pitch P1. The test electrodes 20 form a second set of test electrodes and are equally spaced along the axis V by the pitch P1. The test electrodes 30 form a third set of test electrodes and are equally spaced along the axis V by the pitch P1. The three sets of the electrodes 10, 20, 30 are then merged such that one electrode from any set is placed immediately between two electrodes from the other two sets, respectively. In other words, the three sets of the electrodes 10, 20, 30 are interleaved along the axis V.

The pitch between adjacent two electrodes from the first and the second sets is P6. The pitch between adjacent electrodes from the second the third sets is P7. The pitch between adjacent electrodes from the third and the first sets is P8. In the embodiment shown in FIG. 8, the pitches P6, P7, P8 are equal to each other such that all of the electrodes 10, 20, 30 are equally spaced along the axis V.

The dimension of each one of the test electrodes 10, 20, 30 may be for example 30 µm*30 µm or even smaller with the probe pitch P1 being equal to 115 µm.

Similar to the first embodiment, there are a first set of test structures which are electrically connected to the first set of electrodes 10 only (meaning that the test structures are not electrically connected to the second and third sets of electrodes). There are a second set of test structures which are electrically connected to the second set of electrodes 20 only, and a further third set of test structures which are electrically connected to the third set of electrodes 30 only.

In order to test the performance of the test structures provided within the structure 200, the probe card 8 may be manipulated such that the probe pins 7 are brought into contact with the first set of test electrodes 10 to test the first set of test structures.

Subsequently, the substrate 5 is moved relative to the probe card 8 by a stepping distance equal to the pitch P6 such that the probe pins 7 are moved from the first set of test electrodes 10 to the second set of test electrodes 20 in order to test the second set of test structures. Next, the substrate 5 is moved again relative to the probe card 8 by a stepping distance equal to the pitch P7 such that the probe pins 7 are moved from the second set of test electrodes 20 to the third set of test electrodes 30 in order to test the third set of test structures. In an alternative embodiment, the substrate 5 may stay still and the probe card 8 may be moved relative to the substrate 5 by respective stepping distances such that the probe pins 7 are moved from the first set of test electrodes 10 to the second set of test electrodes 20 and the third set of test electrodes 30 sequentially.

By using the semiconductor structures 100, 200 to replace at least some of the structures 14 within the PCMs 4 of the wafer 1, a larger number of test structures can be arranged within the limited area of the scribe lines 3, thereby allowing the foundries to conduct a more detailed monitoring of the semiconductor manufacturing processes. In case of manufacturing/packaging processes which require metal-free scribe lines 3, the number of chips 2 being sacrificed to accommodate the test structures can be greatly reduced. Further, the interleaving arrangement of various sets of test electrodes within the semiconductor structures 100, 200 is beneficial for saving substrate or probe movement time due to the short travel distance (which is shorter than the probe pitch P1) between the sets of test electrodes. Moreover, the same probe card 8 and its associated testing requirements used to test the structure 14 can be directly used to test the structures 100, 200. In particular, the structures 100, 200 can be tested under the same voltage levels as the structure 14. It would not be necessary to incur further costs to purchase new probe cards with probe arrangements matching the test electrode arrangements within the semiconductor structures 100, 200.

It will be appreciated that because the space between neighbouring electrodes within the structures 100, 200 is more limited than that within the structure 14, not all of the test structures contained within the structure 14 can be placed within the structures 100, 200. As compared to the structure 14, the structures 100, 200 are generally suitable for accommodating test structures of small dimensions, such as but not limited to, resistors (which include metal resistor, polysilicon resistor, etc.), connection vias, and small transistors. Test structures, such as transistor arrays, photodiodes and capacitors, generally have large dimensions and may not be suitable for use within the semiconductor structures 100, 200.

It will be further appreciated the semiconductor structure 100 and/or the semiconductor structure 200 may be provided together with the structure 14 (of the known arrangement of FIGS. 3 and 4) within the PCMs 4 of the wafer 1, to allow the placement of test structures of various dimensions while maximizing the area sufficiency of the PCMs 4. For example, one or more of the structures 14, 100 and 200 may be arranged along an axis to form a test line in a single scribe line. Alternatively, the structure 14 may be placed in a separate scribe line which is in parallel with or perpendicular to the scribe line in which the structure 100 and/or the structure 200 are placed. In any event, the structure 14 is spaced apart from the structures 100, 200 within the PCMs 4.

In the semiconductor structure 100, each of the test electrodes 20 is centred between neighbouring ones of the test electrodes 10. This may be beneficial in that it allows one of the substrate 5 and the probe card 8 to be moved relative to the other by a uniform stepping distance so as to cause the probe pins 7 to move between the first set of test electrodes 10 and the second set of test electrodes 20 in either direction along the axis V. Accordingly, it may facilitate the manipulation of the substrate 5 or the probe card 8 and be beneficial for speeding up the testing process. However, it will be appreciated that this particular arrangement is not essential. Alternatively, each of the test electrodes 20 may be placed at a location away from the centre of neighbouring ones of the test electrodes 10. The offset arrangement may be beneficial in that it allows test structures of different dimensions to be placed between the test electrodes 10, 20.

Likewise, in the semiconductor structure 200, the pitches P6, P7 and P8 may not be equal to each other. It would however be understood that making the pitches P6, P7 and P8 equal to each other advantageously allows one of the substrate 5 and the probe card 8 to be moved relative to the other by a uniform stepping distance so as to cause the probe pins 7 to move between the three sets of test electrodes 10, 20, 30 along the axis V.

FIG. 8 shows that three sets of test electrodes are interleaved along the axis V. It will be appreciated that more than three sets of electrodes may be interleaved. In an example, four sets of electrodes may be interleaved along the axis V. Each set of electrodes are equally spaced along the axis V by the pitch P1, and have a respective set of test structures connected thereto. Having more than three sets of electrodes interleaved would require a further shrink of the dimension of each test electrode. However, there exists a minimum dimension for each test electrode in order for the electrodes to be probed with sufficiency quality by the probe pins 7. This minimum dimension places a restriction on the maximum number of sets of electrodes to be interleaved. Further, it will be appreciated that the electrical wiring between the test structures and the test electrodes becomes more complex if more sets of electrodes are interleaved. The wiring needs to be done carefully to avoid any electrical shorts, which may be detrimental for process control monitoring. This places another restriction on the maximum number of sets of electrodes to be interleaved.

In FIGS. 3 to 8, the axis V along which the test electrodes extend is shown as a straight line. This is mainly for matching the probe arrangement of the probe card 8 in which the probe pins 7 are aligned on a straight line. The probe arrangement of a probe card may vary or may even be customised such that the probe pins are aligned on a non-straight line. In that case, it will be appreciated that the test electrodes shall extend along a corresponding non-straight line in order to use that particular probe card.

In the semiconductor structures 100, 200, each set of test electrodes are equally spaced along the axis V. Again, this is for matching the probe arrangement of the probe card 8 in which the probe pins 7 are equally spaced. It will of course be appreciated that each set of test electrodes may not be equally spaced, depending upon the probe arrangement of a particular probe card being used.

In the semiconductor structures 100, 200, the second set of electrodes 20 (and optionally the third set of electrodes 30 for the structure 200) are disposed completely between neighbouring ones of the first set of electrodes 10. The expression "disposed completely between" means that the centre of each of the second sets of electrodes 20 is located on the centre line (axis V) of the first set of electrodes 10 and accordingly the electrodes 10, 20 are completely overlapping along the axis V. This may be beneficial in that it allows the substrate 5 or the probe card 8 to move along the axis V in order to cause the probe pins 7 to move between different sets of electrodes. However, it will be appreciated that this arrangement is not necessary. It is possible for the second sets of electrodes 20 (and optionally the third set of electrodes 30) to be disposed partially between neighbouring ones of the first set of electrodes 10. The expression "disposed partially between" means that the centre of each of the second and/or third sets of electrodes 20, 30 is located off the centre line (axis V) of the first set of electrodes 10 and the electrodes 10, 20 and/or 10, 30 are partially overlapping along the axis V.

The skilled person will understand that in the preceding description and appended claims, positional terms such as 'top', 'bottom', 'above', 'overlap', 'below', 'lateral', 'vertical', etc. are made with reference to conceptual illustrations of a semiconductor structure, such as those showing standard layout plan views and those shown in the appended drawings. These terms are used for ease of reference but are not intended to be of limiting nature. These terms are therefore to be understood as referring to a semiconductor structure when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor structure comprising:
    a substrate;
    a plurality of test structures on the substrate, wherein the plurality of test structures comprise a first set of test structures and a second set of test structures;
    a plurality of test electrodes provided on the substrate, wherein the test electrodes comprise a first set of electrodes operatively connected to the first set of test structures, and a second set of electrodes operatively connected to the second set of test structures, wherein the first set of electrodes are spaced apart from one another by a first distance and are configured to be operatively connectable to a probe card having a plurality of probe pins spaced apart from one another by the first distance to test the first set of test structures, and wherein the second set of electrodes are spaced apart from one another by the first distance and are configured to be operatively connectable to the probe card to test the second set of test structures; and
    wherein at least one electrode within the second set of electrodes is disposed between adjacent electrodes within the first set of electrodes along a length of the first set of electrodes.

2. The semiconductor structure according to claim 1, wherein the first and second sets of electrodes are arranged in an alternating manner along the length of the first set of electrodes.

3. The semiconductor structure according to claim 1, wherein the first and second sets of electrodes are interleaved along the length of the first set of electrodes.

4. The semiconductor structure according to claim 1, wherein the plurality of test electrodes are process control monitoring, PCM, pads.

5. The semiconductor structure according to claim 1, wherein at least some electrodes within the first set of electrodes have a uniform first dimension, and at least some electrodes within the second set of electrodes have a uniform second dimension; and
    optionally wherein the first dimension is identical to the second dimension.

6. The semiconductor structure according to claim 1, wherein the first and second sets of test structures comprise at least one of a resistor, a connection via, and a transistor.

7. The semiconductor structure according to claim 1, wherein the first set of electrodes are arranged along a first axis, and the second set of electrodes are arranged along the first axis; and/or
wherein at least one electrode within the second set of electrodes is centred between adjacent electrodes within the first set of electrodes along the length of the first set of electrodes.

8. The semiconductor structure according to claim 1, wherein:
the plurality of test structures comprise a third set of test structures;
the test electrodes comprise a third set of electrodes operatively connected to the third set of test structures; and
the third set of electrodes are spaced apart from one another by the first distance and are configured to be operatively connectable to the probe card to test the third set of test structures.

9. The semiconductor structure according to claim 8, wherein at least one electrode within the third set of electrodes is disposed immediately between one of the first set of electrodes and one of the second set of electrodes along the length of the first set of electrodes; and/or
wherein the first, second and third sets of electrodes are interleaved along the length of the first set of electrodes.

10. The semiconductor structure according to claim 8, wherein the third set of electrodes are spaced apart from the first and the second sets of electrodes; and optionally
wherein at least one of the third set of test structures has a larger dimension than at least one of the first and second sets of test structures.

11. The semiconductor structure according to claim 8, wherein:
the plurality of test structures comprise a fourth set of test structures;
the test electrodes comprise a fourth set of electrodes operatively connected to the fourth set of test structures;
the fourth set of electrodes are spaced apart from one another by the first distance and are configured to be operatively connectable to the probe card to test the fourth set of test structures, and
the first, second, third and fourth sets of electrodes are interleaved along the length of the first set of electrodes.

12. A semiconductor testing system, comprising:
the semiconductor structure according to claim 1; and
a probe card which comprises a plurality of probe pins spaced from one another by the first distance.

13. A method of testing a semiconductor structure using a probe card, wherein the probe card comprises a plurality of probe pins spaced apart from one another by a first distance, the method comprising:
providing a semiconductor structure, the semiconductor structure comprising:
a substrate;
a plurality of test structures on the substrate, wherein the plurality of test structures comprise a first set of test structures and a second set of test structures; and
a plurality of test electrodes on the substrate, wherein the test electrodes comprise a first set of electrodes operatively connected to the first set of test structures, and a second set of electrodes operatively connected to the second set of test structures, wherein the first set of electrodes are spaced apart from one another by the first distance, and the second set of electrodes are spaced apart from one another by the first distance, and wherein at least one electrode within the second set of electrodes is disposed between adjacent electrodes within the first set of electrodes along a length of the first set of electrodes;
operatively connecting the probe pins to the first set of electrodes to test the first set of test structures; and
operatively connecting the probe pins to the second set of electrodes to test the second set of test structures.

14. The method according to claim 13, further comprising:
moving one of the probe card and the semiconductor substrate relative to the other of the probe card and the semiconductor substrate by a distance which is less than the first distance such that the probe pins are moved from the first set of electrodes to the second set of electrodes.

15. The method according to claim 13, further comprising:
manufacturing a plurality of semiconductor chips on the substrate, and wherein the plurality of semiconductor chips are separated from one another by scribe lines; and optionally
wherein the plurality of test electrodes are disposed in at least one of the scribe lines or at least one of the semiconductor chips.

16. The method according to claim 13, further comprising:
moving one of the probe card and the semiconductor substrate relative to the other of the probe card and the semiconductor substrate by a distance which is equal to a half of the first distance such that the probe pins are moved from the first set of electrodes to the second set of electrodes.

17. The method according to claim 13, wherein:
the plurality of test structures comprise a third set of test structures,
the test electrodes comprise a third set of electrodes operatively connected to the third set of test structures,
the third set of electrodes are spaced apart from one another by the first distance, and
the method further comprises operatively connecting the probe pins to the third set of electrodes to test the third set of test structures.

18. The A method according to claim 17, further comprising:
moving one of the probe card and the semiconductor substrate relative to the other of the probe card and the semiconductor substrate by a distance which is less than the first distance such that the probe pins are moved from the first set of electrodes or the second set of electrodes to the third set of electrodes.

19. The method according to claim 17, further comprising:
moving one of the probe card and the semiconductor substrate relative to the other of the probe card and the semiconductor substrate by a distance which is equal to a third of the first distance such that the probe pins are moved from the first set of electrodes or the second set of electrodes to the third set of electrodes.

20. A semiconductor structure for use in the method according to claim 13.

* * * * *